United States Patent [19]
Bracchitta et al.

[11] Patent Number: 6,130,469
[45] Date of Patent: Oct. 10, 2000

[54] ELECTRICALLY ALTERABLE ANTIFUSE USING FET

[75] Inventors: John A. Bracchitta, South Burlington; Wilbur D. Pricer, Charlotte, both of Vt.

[73] Assignee: International Business Machines Corporation, Armonk, N.Y.

[21] Appl. No.: 09/066,122

[22] Filed: Apr. 24, 1998

[51] Int. Cl.[7] .......................... H01L 29/00; H01L 29/04; H01L 29/74; H01L 23/58

[52] U.S. Cl. .......................... 257/530; 257/529; 257/50; 257/665; 257/173

[58] Field of Search .................................. 257/387, 530, 257/50, 529

[56] References Cited

U.S. PATENT DOCUMENTS

| | | | |
|---|---|---|---|
| 5,110,754 | 5/1992 | Lowrey et al. | 437/52 |
| 5,266,829 | 11/1993 | Hamdy et al. | 257/530 |
| 5,345,110 | 9/1994 | Renfro et al. | 307/272.3 |
| 5,365,110 | 11/1994 | Matsuoka | 257/762 |
| 5,550,400 | 8/1996 | Takagi et al. | 257/530 |
| 5,581,505 | 12/1996 | Lee | 365/189.11 |
| 5,780,919 | 7/1998 | Chua et al. | 257/50 |
| 5,866,937 | 2/1999 | McCollum | 257/530 |
| 5,962,911 | 10/1999 | Manley | 257/530 |
| 5,988,835 | 12/1999 | Furukawa et al. | 257/530 |

*Primary Examiner*—David Hardy
*Assistant Examiner*—Jesse A. Fenty
*Attorney, Agent, or Firm*—John J. Goodwin

[57] ABSTRACT

An integrated circuit and fabrication method for an antifuse structure that includes a shallow trench oxide isolation region disposed in a silicon substrate, the oxide in the trench having a top surface recessed below the surface of the substrate to form sharp corners at each side of the trench. The substrate includes diffusion regions adjacent to the sharp corners, electrical insulation layers over the diffusion regions, and an electrical conductor is disposed over the recessed oxide in the trench. When voltage is applied on the electrical conductor, a high field point is produced at the sharp corners causing the electrical insulation layer at the corners to break down and create a short circuit between the electrical conductor and the diffusions, thus providing a fuse function.

5 Claims, 2 Drawing Sheets

ELECTRICALLY ALTERABLE ANTIFUSE USING FET

BACKGROUND OF THE INVENTION

1. Field of The Invention

The present invention relates to programmable integrated circuit devices, and more particularly to an antifuse structure for electrically altering the characteristics of an integrated circuit.

2. Background Art

The function or operating characteristics of integrated circuits may be altered by making discretionary connections using either fusible links or antifusible links, wherein a fusible link is one that provides a closed connection when first formed and an antifusible link is one that provides an open connection when first formed.

Typical examples of fuse technology are described in U.S. Pat. No. 5,345,110 issued Sep. 6, 1994 to Renfro et al., U.S. Pat. No. 5,581,505 issued Dec. 3, 1996 to Lee.

SUMMARY OF THE INVENTION

An object of the present invention is to provide an improved antifuse apparatus for permanently altering an integrated circuit by electrical means.

Another object of the present invention is to provide an electrically alterable antifuse apparatus that allows other circuits to be located nearby.

Still another object of the present invention is to provide an antifuse apparatus that does not require a significant amount of additional processing and that can operate with low power supply voltage devices in state of the art technology.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE INVENTION

Fuses and antifuses are employed in integrated circuits to encode information on a circuit chip at the time of manufacture. The encoded information is used to later identify the chip, to enable or tune circuits depending on test results, or to repair defective regions of the chip by enabling spare or redundant circuits. A fuse link is one that provides a closed connection when first formed and an antifuse link is one that provides an open connection when first formed.

The typical method for providing fuses is to form small wires that can be selectively ablated with a precisely positioned laser beam thereby encoding the necessary information as a series of bits. A drawback with this method is that the area required by the region damaged by each laser ablation is so large that features and devices can not be fabricated near the fuses. Another drawback with laser ablated fuses is that they do not scale with lithography.

The present invention provides an electrical antifuse structure that includes an MOS capacitor in series with two FET devices wherein one of the conducting plates of the capacitor is fabricated in the silicon area adjacent to a Shallow Trench Isolation (STI) region. The adjacent STI region is recessed below the silicon substrate surface forming sharp corners at the silicon surface adjacent to the STI. The dielectric region of the capacitor is the same film as used for the FET gate dielectric, and this gate dielectric is grown on the surface of the silicon substrate.

Figure 1:
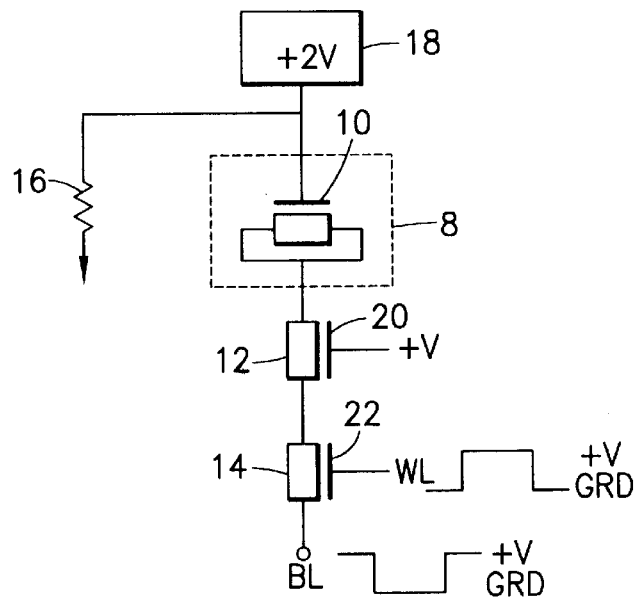
FIG. 1 is a schematic illustration of an innovative circuit configuration with gate dielectric antifuse structure used in explaining the present invention.

Referring to FIG. 1, a schematic circuit configuration of an innovative circuit and dielectric antifuse cell of the type used in the present invention is shown consisting of a fuse cell 8 including an MOS capacitor 10 in series with two FET devices 12 and 14. Fuse cell 8 is connected to resistor 16 and a +2V voltage source 18. The gate electrode 20 of FET device 12 is connected to a potential +V and the gate 22 of FET device 14 is connected to a wordline voltage WL. FET device 14 is also connected to a bitline voltage BL. The WL and BL voltages are as shown in FIG. 1.

Figure 2:
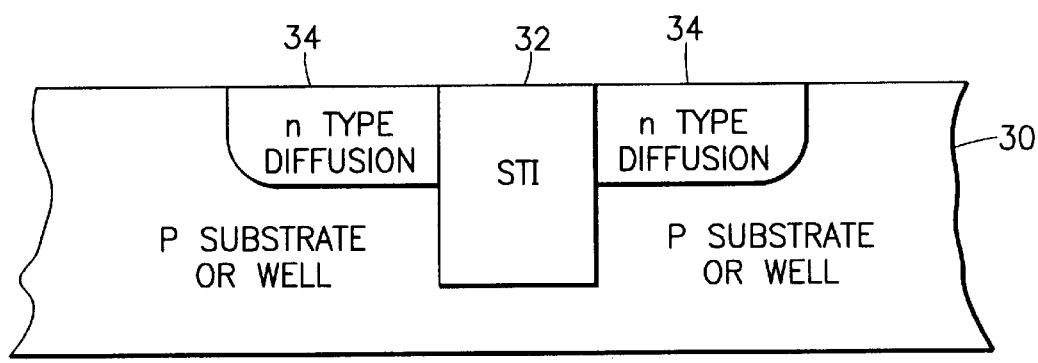
FIG. 2 is a schematic cross-section of a masking step used in the fabrication of the antifuse apparatus of the present invention.

Referring to FIG. 2, in the initial step of the process of the present invention a fuse cell structure is fabricated wherein a trench is formed in a silicon P-substrate 30 which is filled in with oxide and planarized, typically with chemical-mechanical polishing, to form STI region 32. A first light doping implant is then performed through a mask to provide n-type diffusions 34 on each side of STI region 22. The n-well ion implant used in CMOS processing would suffice for this purpose.

Figure 3:
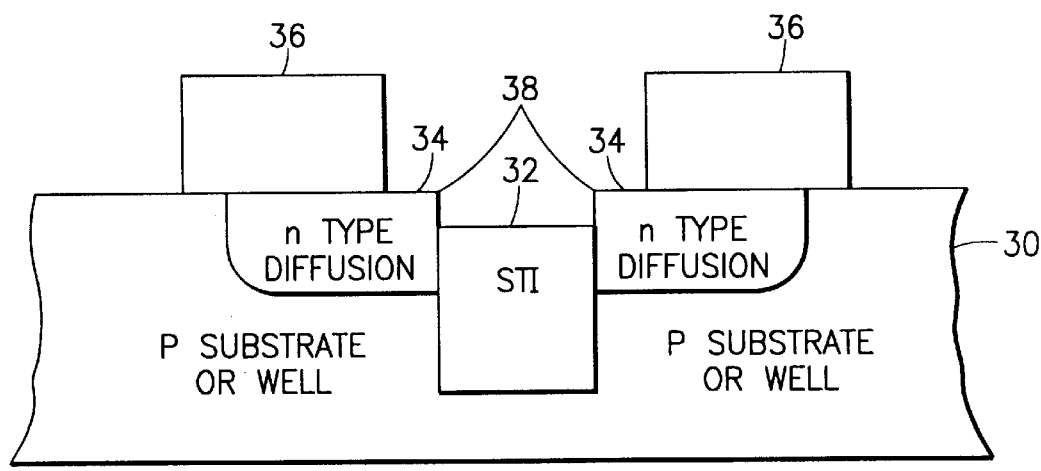
FIG. 3 is a schematic cross-section illustration of a further masking step used in the fabrication of the antifuse apparatus of the present invention.

Next, as shown in FIG. 3, an etch mask 36 is formed that is set back from the edges of the STI trench 32. A preferential etch, such as hydrofluoric acid etch is then used to etch down and remove a portion of the oxide in STI trench 32, but the etch does not attack the silicon of substrate 30, thereby forming sharp corners 38 at the edges of trench 32. The areas of diffusions 34 not covered by mask 36 are then further doped by an implant through the mask 36 to increase the concentration of the diffusions 34 at the corners 38. The corners 38 are the points of electrical breakdown of two antifuse structures. It should be noted that a single mask 36 is used for both the etching step and the second implant step.

Figure 4:
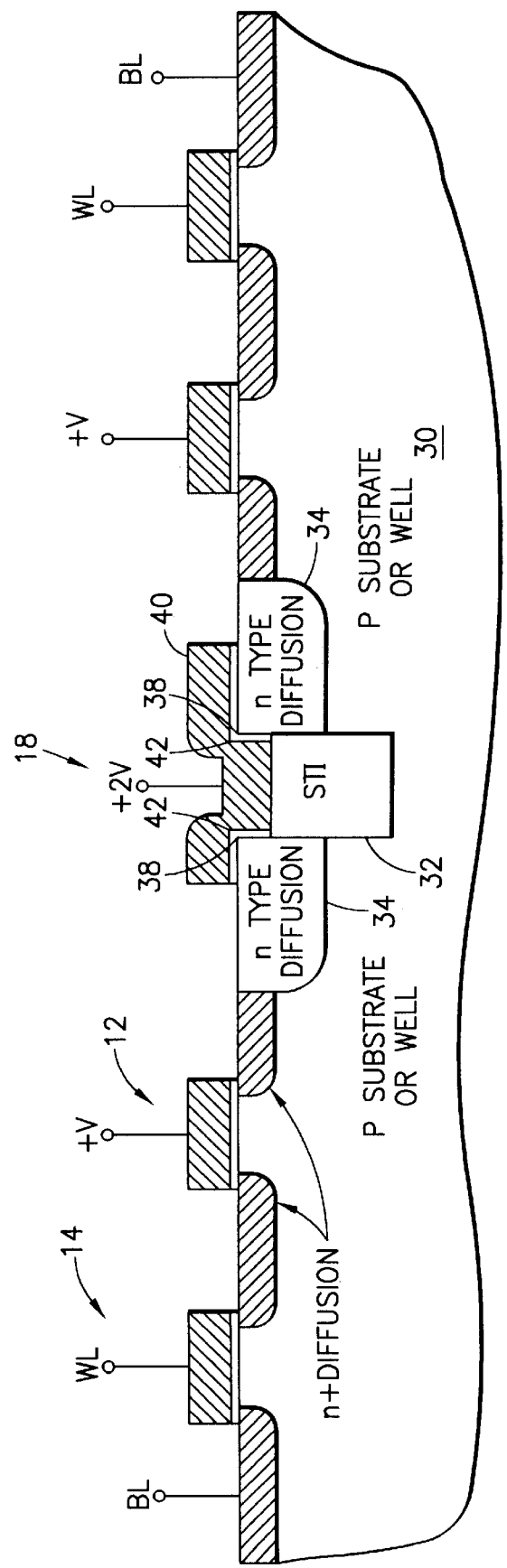
FIG. 4 is a schematic cross-section of an embodiment of two mirror image cells incorporating the present invention.

Referring to FIG. 4, an oxidation or deposition step forms oxide regions 42 over the diffusions 34 including the corners 38. The structure is further processed by normal FET device fabrication steps to form a recessed gate element 40 above the trench isolation 32 and over the oxide regions 42 that serve as dielectric insulation between the diffusions 34 and the recessed gate 40. The recessed gate 40 is depicted asymmetrically to indicate that the gate does not need to be exactly aligned to STI region 32. It should be noted that the diffusions 34 that function as the FET device junctions extend below the recessed gate 40. This is achieved by using sufficient ion implant energy, angled implants, or combinations of both. When a voltage is applied to gate element 40 it produces a high field point at the corners 38 of which catastrophically breaks down the oxide 42 at the corners and causes a short circuit between the gate element 40 and the implanted diffusions 34, thus providing a fuse function. Two antifuse structures are therefore obtained at the corners 38 with one minimum image and one overlay, creating a dense, low voltage antifuse pair.

FIG. 4 also shows the FET devices 12 and 14, the bitline BL, the wordline WL and the voltage +V.

What has been described is an antifuse structure and its method of fabrication that is electrically alterable, which allows other circuits to be constructed nearby, is simple to fabricate and works with low power supply voltage devices.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. Apparatus comprising:
   a conductor;
   a substrate;
   an isolation region extending into the substrate;
   a doped substrate region shallower than and adjacent to the isolation region and comprising a corner extending toward the conductor capable of providing a high e-field when a voltage is applied between the conductor and the doped substrate region; and an insulation layer between the conductor and the doped substrate region for shorting the conductor to the doped substrate region under the high e-field;
   wherein the isolation region comprises a top surface recessed below a top surface of the substrate and the conductor extends below the top surface of the substrate.

2. Apparatus of claim 1 further comprising an FET adjacent the doped substrate region, the FET including a gate insulator formed simultaneously with the insulation layer.

3. An antifuse structure comprising
   a substrate,
   an oxide isolation region disposed within a trench in said substrate and having an upper surface recessed below the level of said substrate top surface to form at least one corner where one side of said oxide isolation region in said trench is adjacent to said substrate,
   at least one doped region implanted in said substrate surface to form a diffusion region at said at least one corner adjacent to said isolation region,
   an electrical insulation layer disposed over said at least one doped diffusion region at said at least one corner,
   an electrical conductor means disposed over said isolation region and said electrical insulation layer at said at least one corner wherein a voltage applied to said electrical conductor means produces a high e-field at said at least one corner that causes a breakdown of said electrical insulation layer at said at least one corner to produce a short circuit between said electrical conductor means and said at least one doped diffusion region.

4. An antifuse structure according to claim 3 wherein said oxide isolation region in said trench forms a second corner located where a second side of said oxide isolation region is adjacent to said substrate, and said structure further includes a second doped region implanted in said substrate surface to form a second diffusion region at said second corner adjacent to said isolation region and electrical insulation layer over said second diffusion, said second corner producing a high e-field when a voltage is applied to said electrical conductor means that causes a breakdown of said electrical insulation layer at said second corner to cause a short circuit between said electrical conductor means and said second doped diffusion region.

5. An antifuse structure according to claim 3 wherein said electrical conductor means disposed over said oxide isolation region extends below the top surface of said substrate.

* * * * *